(12) United States Patent
Irie et al.

(10) Patent No.: US 11,177,407 B2
(45) Date of Patent: Nov. 16, 2021

(54) METHOD FOR MANUFACTURING SOLAR CELL, SOLAR CELL, AND SOLAR CELL MODULE

(71) Applicant: KANEKA CORPORATION, Osaka (JP)

(72) Inventors: Tooru Irie, Osaka (JP); Wataru Yoshida, Osaka (JP); Kunta Yoshikawa, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/821,572

(22) Filed: Mar. 17, 2020

(65) Prior Publication Data

US 2020/0220037 A1    Jul. 9, 2020

Related U.S. Application Data

(63) Continuation of application No. PCT/JP2018/033640, filed on Sep. 11, 2018.

(30) Foreign Application Priority Data

Oct. 4, 2017   (JP) .............................. JP2017-194610

(51) Int. Cl.
*H01L 25/00* (2006.01)
*H01L 31/00* (2006.01)
(Continued)

(52) U.S. Cl.
CPC .. *H01L 31/0516* (2013.01); *H01L 31/022441* (2013.01); *H01L 31/022475* (2013.01); *H01L 31/022483* (2013.01); *H01L 31/188* (2013.01)

(58) Field of Classification Search
CPC ......... H01L 31/0516; H01L 31/022441; H01L 31/022475; H01L 31/022483; H01L 31/188; H01L 31/02363; H01L 31/02366
See application file for complete search history.

(56) References Cited

U.S. PATENT DOCUMENTS

2007/0169805 A1*  7/2007  Sasaki ............. H01L 31/022466
                                                        136/256
2013/0153023 A1   6/2013  Mori et al.
(Continued)

FOREIGN PATENT DOCUMENTS

JP   2012049183 A   3/2012
JP   2018050006 A   3/2018
(Continued)

OTHER PUBLICATIONS

International Search Report issued in corresponding International Application No. PCT/JP2018/033640, dated Dec. 18, 2018 (2 pages).
(Continued)

*Primary Examiner* — Angelo Trivisonno
(74) *Attorney, Agent, or Firm* — Osha Bergman Watanabe & Burton LLP

(57) ABSTRACT

A method of manufacturing a back electrode type solar cell, may include forming by physical vapor deposition at least one layer of an electrode material film on both a first conductivity type semiconductor layer, to give a first electrode layer, and a second conductivity type semiconductor layer, to give a second electrode layer, and patterning the first electrode layer and the second electrode layer each in a strip-like shape such that the first electrode layer and the second electrode layer both extend in a first direction and are arranged in a second direction by removing a part of the electrode material film.

8 Claims, 9 Drawing Sheets

(51) Int. Cl.
  *H02N 6/00*      (2006.01)
  *H01L 31/05*     (2014.01)
  *H01L 31/0224*   (2006.01)
  *H01L 31/18*     (2006.01)

(56) References Cited

U.S. PATENT DOCUMENTS

2013/0167915 A1* 7/2013 Moslehi .............. H01L 31/18
                                              136/255
2014/0020752 A1* 1/2014 Arimoto ............ H01L 31/0747
                                              136/256
2016/0284923 A1   9/2016 Johnson et al.
2018/0069144 A1   3/2018 Kawasaki et al.

FOREIGN PATENT DOCUMENTS

| WO | 2012132615 A1 | 10/2012 |
| WO | 2016051993 A1 | 4/2016 |
| WO | 2016114371 A1 | 7/2016 |
| WO | 2016158226 A1 | 10/2016 |

OTHER PUBLICATIONS

Written Opinion of the International Searching Authority issued in corresponding International Application No. PCT/JP2018/033640, dated Dec. 18, 2018 (5 pages).

* cited by examiner

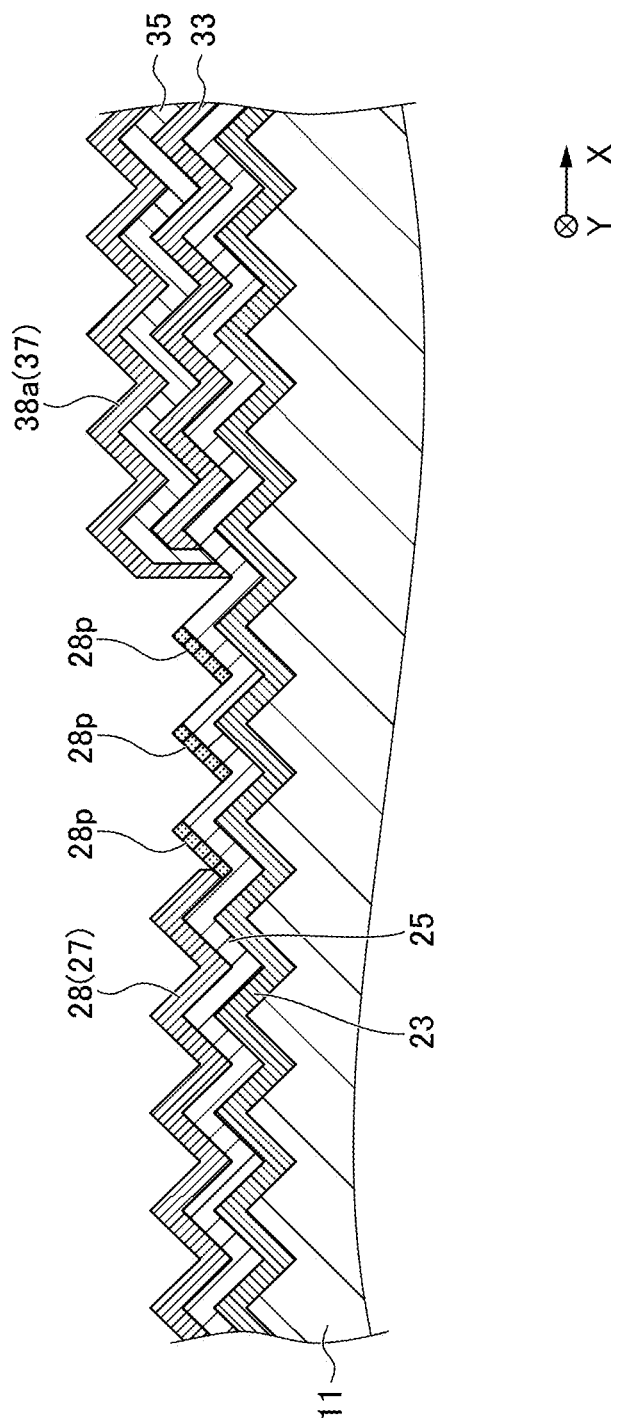

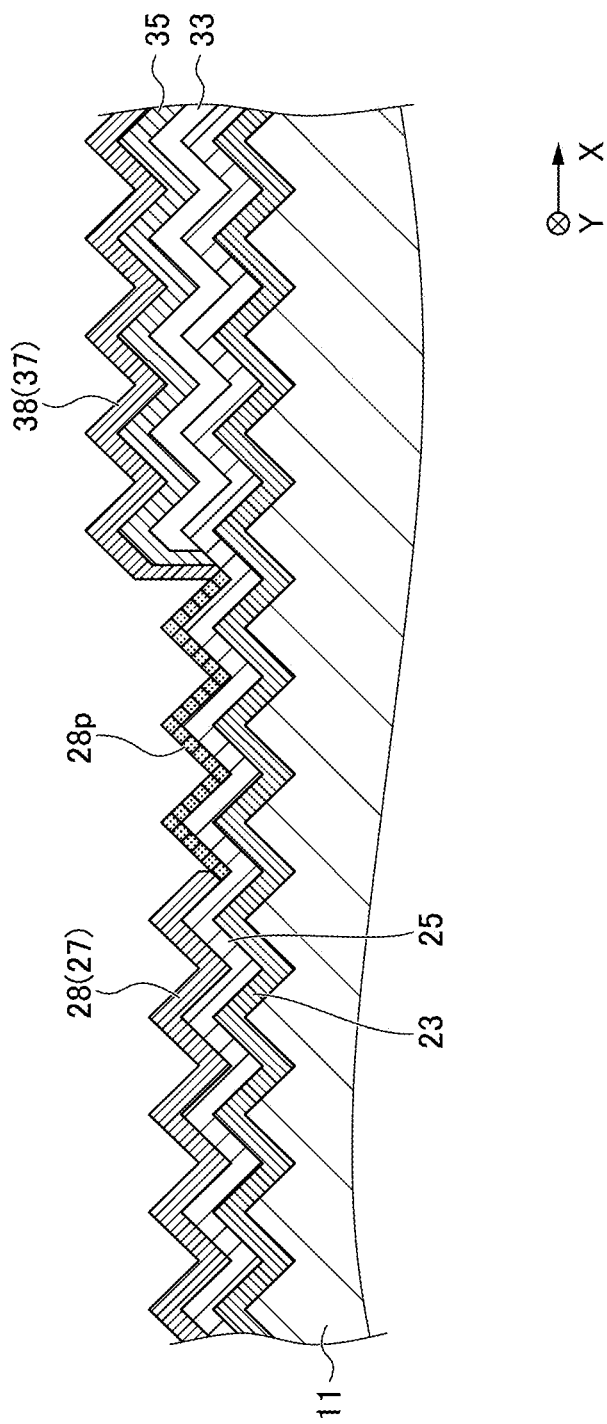

METHOD FOR MANUFACTURING SOLAR CELL, SOLAR CELL, AND SOLAR CELL MODULE

TECHNICAL FIELD

One or more embodiments relate to a method of manufacturing a back electrode type (back contact type) solar cell, a solar cell, and a solar cell module including the solar cell.

BACKGROUND

Examples of a solar cell using a semiconductor substrate include a double-sided electrode type solar cell having electrodes formed on the both surfaces of a light reception surface and a back surface, and a back electrode type solar cell having electrodes formed only on the back surface. Since such a double-sided electrode type solar cell has electrodes formed on the light reception surface, the electrodes shield sunlight. On the other hand, such a back electrode type solar cell has no electrode formed on the light reception surface, and thus such a back electrode type solar cell has higher receiving efficiency of sunlight as compared with such a double-sided electrode type solar cell. Patent Document 1 discloses a back electrode type solar cell.

The solar cell disclosed in Patent Document 1 includes a semiconductor substrate functioning as a photoelectric conversion layer, a first conductivity type semiconductor layer and a first electrode layer sequentially laminated on a part of a back surface of the semiconductor substrate, and a second conductivity type semiconductor layer and a second electrode layer sequentially laminated on a different part of the back surface of the semiconductor substrate. In this solar cell, to reduce reflection of incident light and improve optical confinement effect in the semiconductor substrate, a light reception surface of the semiconductor substrate is provided with a fine uneven structure having a pyramidal shape called a texture structure. In this solar cell, to increase efficiency of collecting light having passed through the semiconductor substrate without being absorbed in the semiconductor substrate, a similar uneven structure (texture structure) is formed on the back surface (electrode forming surface) of the semiconductor substrate.

Patent Document 1: PCT International Publication No. WO2016/114371

In such a solar cell, a physical vapor deposition (PVD) method such as a sputtering method is used as a method of forming the first electrode layer and the second electrode layer, for example. More specifically, an electrode material film is formed using the physical vapor deposition method on the first conductivity type semiconductor layer and the second conductivity type semiconductor layer laminated on the back surface of the semiconductor substrate (electrode material film forming step). Then, patterning of removing a part of the electrode material film is performed using a method such as photolithography, thereby forming the first electrode layer and the second electrode layer separated from each other (patterning step).

In the back electrode type solar cell described above using the semiconductor substrate with the uneven structure (texture structure) provided on the back surface, forming the first electrode layer and the second electrode layer using the physical vapor deposition method increases a leakage current between the first electrode layer and the second electrode layer, and this may cause reduction in fill factor.

SUMMARY

One or more embodiments provide a method of manufacturing a solar cell suppressing an increase in leakage current between electrode layers to suppress a reduction in fill factor, a solar cell, and a solar cell module including a solar cell.

A solar cell manufacturing method according to one or more embodiments is a method of manufacturing a back electrode type solar cell including a semiconductor substrate having an uneven structure on at least one surface of two major surfaces of the semiconductor substrate, a first conductivity type semiconductor layer and a first electrode layer sequentially laminated on a part of the one surface of the semiconductor substrate, and a second conductivity type semiconductor layer and a second electrode layer sequentially laminated on a different part of the one surface of the semiconductor substrate. The method of one or more embodiments includes: an electrode material film forming step of forming at least one layer of an electrode material film on the first conductivity type semiconductor layer and the second conductivity type semiconductor layer laminated on the one surface of the semiconductor substrate using a physical vapor deposition method; and a patterning step of forming the first electrode layer and the second electrode layer each in a strip-like shape in such a manner that the first electrode layer and the second electrode layer extend in a first direction and are arranged in a second direction intersecting the first direction by patterning of removing a part of the electrode material film. In the electrode material film forming step of one or more embodiments, the electrode material film is formed while the semiconductor substrate on which the first conductivity type semiconductor layer and the second conductivity type semiconductor layer are laminated is conveyed in the second direction.

A solar cell according to one or more embodiments is a back electrode type solar cell including a semiconductor substrate having an uneven structure on at least one surface of two major surfaces of the semiconductor substrate, a first conductivity type semiconductor layer and a first electrode layer sequentially laminated on a part of the one surface of the semiconductor substrate, and a second conductivity type semiconductor layer and a second electrode layer sequentially laminated on a different part of the one surface of the semiconductor substrate. In one or more embodiments, the first electrode layer and the second electrode layer each have a strip-like shape extending in a first direction and are arranged in a second direction intersecting the first direction. Residues of an electrode material of the first electrode layer and the second electrode layer are present between the first electrode layer and the second electrode layer adjacent to each other. Some of the residues have shapes in which parts of a protrusion of the semiconductor substrate are reflected and are connected in the first direction.

A solar cell module according to one or more embodiments includes the solar cell described above.

According to one or more embodiments, a solar cell suppressing increase in leakage current between electrode layers to suppress reduction in fill factor, and a solar cell module including the solar cell are manufactured.

BRIEF DESCRIPTION OF THE DRAWINGS

FIG. 5A shows residues of an electrode material in the boundary region between the transparent electrode layers in the solar cell according to one or more embodiments;

FIG. 5B shows residues of an electrode material in a boundary region between transparent electrode layers in a conventional solar cell;

DETAILED DESCRIPTION

Figure 1:
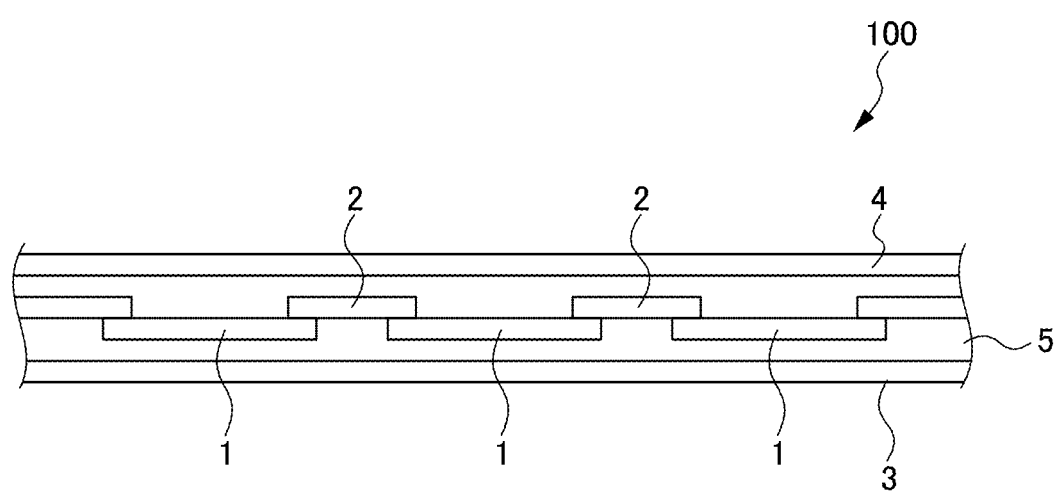
FIG. 1 is a side view illustrating one example of a solar cell module according to one or more embodiments.

Examples of one or more embodiments will be described below by referring to the accompanying drawings. It is noted that, in the drawings, the same or corresponding parts are denoted by the same reference numerals. For the sake of convenience, hatching, member reference numerals, etc. may be omitted. However, in such cases, other drawings shall be referred to.

(Solar Cell Module)

FIG. 1 is a side view illustrating one example of a solar cell module according to one or more embodiments. As shown in FIG. 1, a solar cell module 100 includes a plurality of solar battery cells 1 arranged in a two-dimensional form.

The solar battery cells 1 are connected in series and/or in parallel by wiring members 2. Specifically, each of the wiring members 2 is connected to a bus bar part (to be described below) in an electrode of each of the solar battery cells 1. The wiring member 2 is a publicly-known interconnector, for example, a tab.

The solar battery cells 1 and the wiring members 2 are sandwiched by a light reception surface protective member 3 and a back surface protective member 4. Space between the light reception surface protective member 3 and the back surface protective member 4 is filled with a liquid or solid sealing material 5, whereby the solar battery cells 1 and the wiring members 2 are sealed. The light reception surface protective member 3 is, for example, a glass substrate. The back surface protective member 4 is a glass substrate, a metal plate, or a complex sheet with multiple layers of a metal layer and a resin layer. The sealing material 5 is made of, for example, transparent resin. The solar battery cell (hereinafter, referred to as a solar cell) 1 will be described below in detail.

(Solar Cell)

Figure 2:
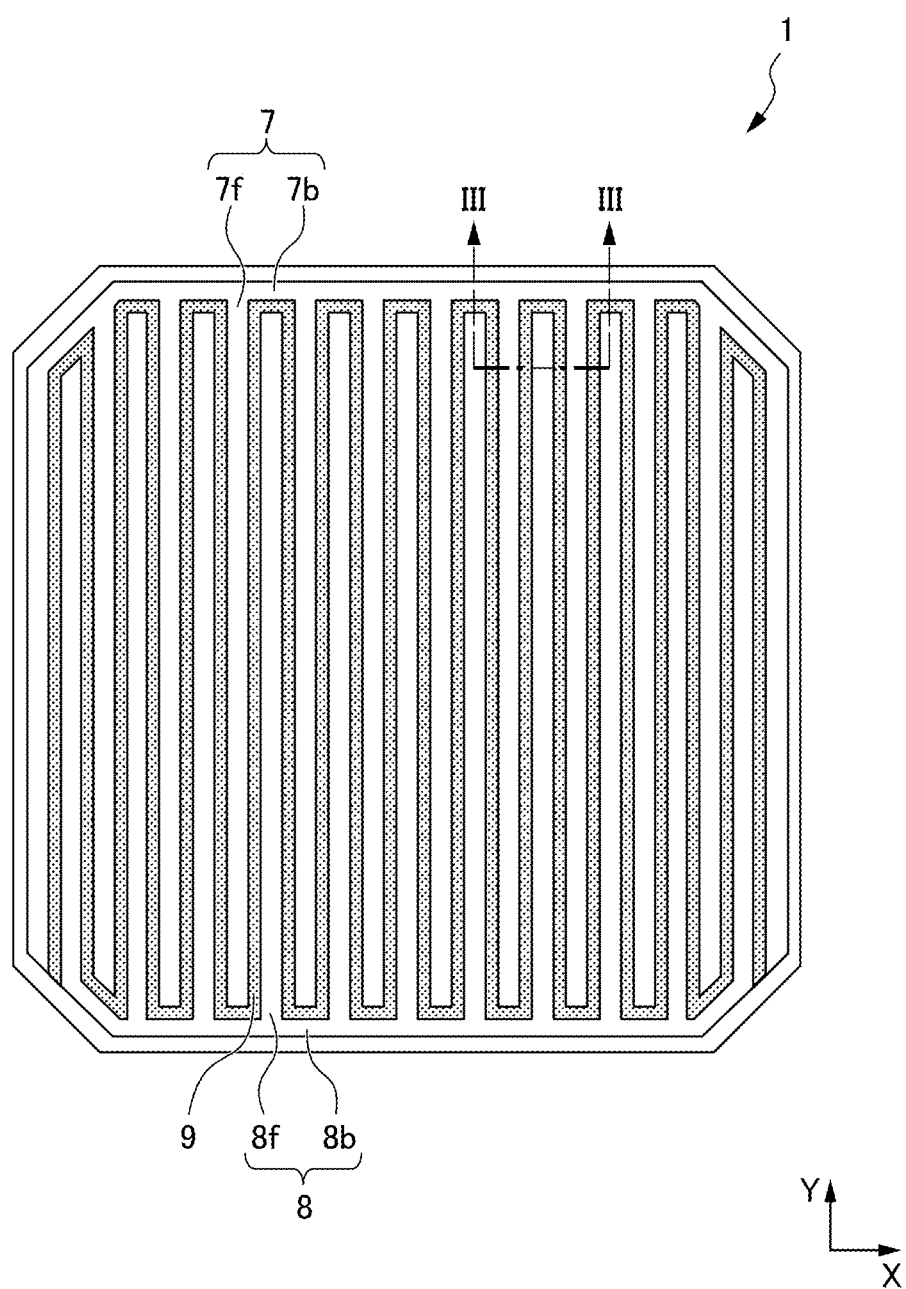
FIG. 2 shows a solar cell according to one or more embodiments as viewed from a back surface side.

FIG. 2 shows the solar cell according to one or more embodiments as viewed from a back surface side. The solar cell 1 shown in FIG. 2 is a back electrode type solar cell. The solar cell 1 includes a semiconductor substrate 11 with two major surfaces and includes a first conductivity type region 7 and a second conductivity type region 8 on the major surfaces of the semiconductor substrate 11.

The first conductivity type region 7 is formed into a so-called comb shape with a plurality of finger parts 7f corresponding to comb teeth and a bus bar part 7b corresponding to a supporting part of the comb teeth. The bus bar part 7b extends in an X direction (second direction) along one peripheral portion of the semiconductor substrate 11. The finger parts 7f extend from the bus bar part 7b in a Y direction (first direction) intersecting the X direction. Similarly, the second conductivity type region 8 is formed into a so-called comb shape with a plurality of finger parts 8f corresponding to comb teeth and a bus bar part 8b corresponding to a supporting part of the comb teeth. The bus bar part 8b extends in the X direction (second direction) along the other peripheral portion facing the one peripheral portion of the semiconductor substrate 11. The finger parts 8f extend from the bus bar part 8b in the Y direction (first direction). The finger parts 7f and the finger parts 8f are formed into strip-like shapes extending in the Y direction (first direction) and arranged alternately in the X direction (second direction). The first conductivity type region 7 and the second conductivity type region 8 may be formed into stripe shapes.

The first conductivity type region 7 and the second conductivity type region 8 are separated across a boundary region 9.

Figure 3:
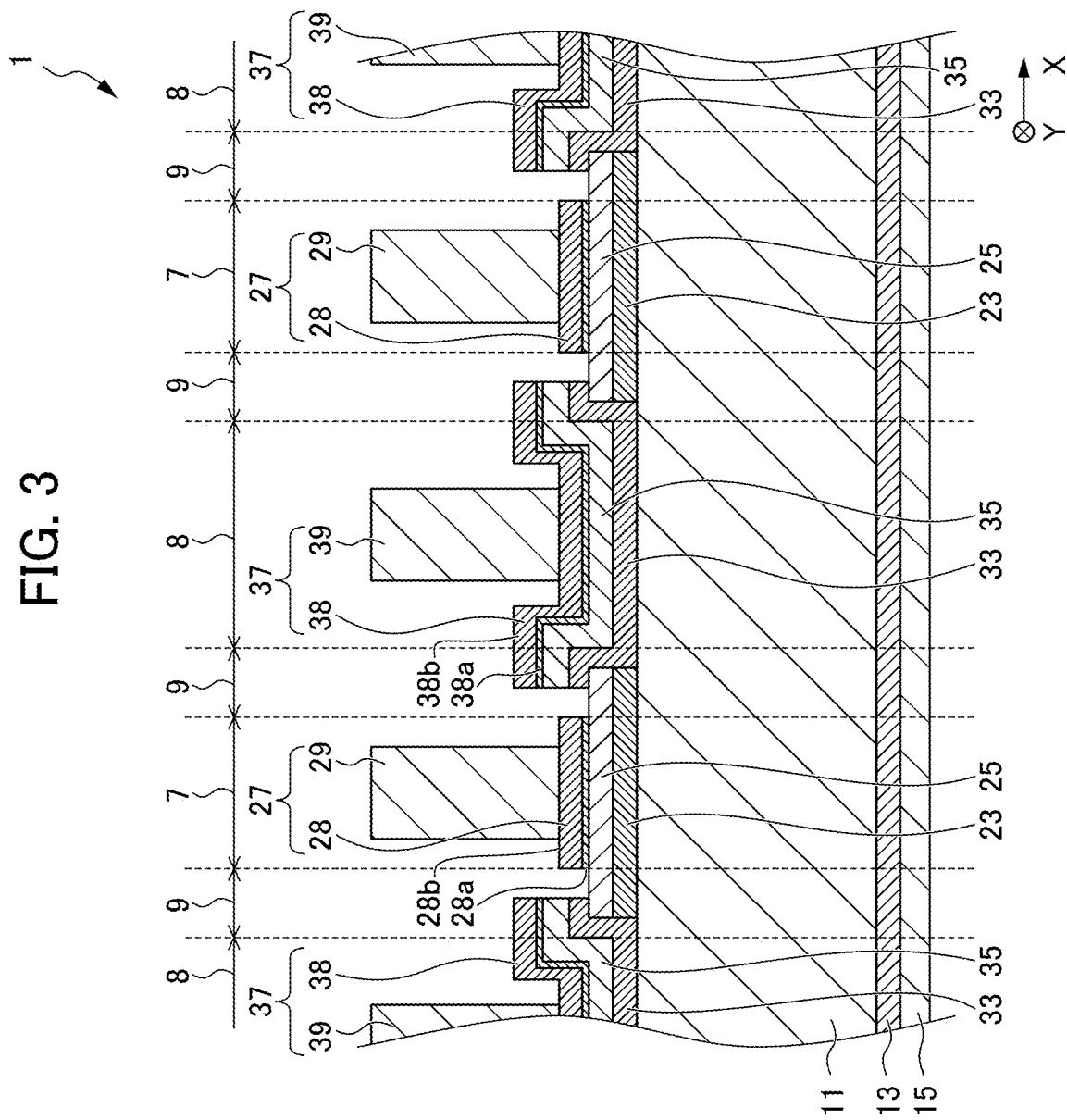
FIG. 3 is a cross-sectional view taken along a line III-III in the solar cell shown in FIG. 2.

FIG. 3 is a cross-sectional view taken along a line III-III in the solar cell shown in FIG. 2. As shown in FIG. 3, the solar cell 1 includes a junction layer 13 and an anti-reflective layer 15 sequentially laminated on one major surface on a light reception side of the major surfaces of the semiconductor substrate 11. The solar cell 1 further includes a junction layer 23, a first conductivity type semiconductor layer 25, and a first electrode layer 27 sequentially laminated on a part of a back surface (mainly, in the first conductivity type region 7) corresponding to the other of the major surfaces of the semiconductor substrate 11 on the opposite side of the light reception surface. The solar cell 1 further includes a junction layer 33, a second conductivity type semiconductor layer 35, and a second electrode layer 37 sequentially laminated on a different part of the back surface (mainly, in the second conductivity type region 8) of the semiconductor substrate 11.

<Semiconductor Substrate>

In one or more embodiments, a conductive single crystal silicon substrate, for example, an n-type single crystal silicon substrate or a p-type single crystal silicon substrate is used as the semiconductor substrate 11. This achieves high photoelectric conversion efficiency. The semiconductor substrate 11 may be an n-type single crystal silicon substrate. In an n-type single crystalline silicon substrate, a carrier lifetime is longer. This is because, in a p-type single crystal silicon substrate, light induced degradation (LID) may occur, in which light irradiation affects boron (B), which is a p-type dopant, and thereby a carrier becomes a recombination center. On the other hand, in an n-type single crystal silicon substrate, LID is further suppressed from occurring.

In one or more embodiments, the semiconductor substrate 11 has a fine uneven structure of a pyramidal shape called a texture structure provided on the back surface. This increases efficiency of collecting light having passed through the semiconductor substrate 11 without being absorbed in the semiconductor substrate 11. The semiconductor substrate 11 may have a fine uneven structure of a pyramidal shape called a texture structure provided on the light reception surface. This reduces reflection of incident light on the light reception surface to improve optical confinement effect in the semiconductor substrate 11.

In one or more embodiments, the thickness of the semiconductor substrate 11 may be between 50 and 250 μm inclusive, between 60 and 230 μm inclusive, or between 70 and 210 μm inclusive. This reduces costs of material. It is noted that, as the semiconductor substrate 11, a conductive polycrystalline silicon substrate may be used, for example, an n-type polycrystalline silicon substrate or a p-type polycrystalline silicon substrate. In this case, a solar cell is manufactured at lower costs.

<Anti-Reflective Layer>

In one or more embodiments, the anti-reflective layer 15 is formed on the light reception surface of the semiconductor substrate 11 via the junction layer 13. The junction layer 13 is formed as an intrinsic silicon-based layer. A translucent film having a refractive index of approximately 1.5 to 2.3 inclusive may be used as the anti-reflective layer 15. As a material of the anti-reflective layer 15, SiO, SiN, SiON, or a stack of these materials may be used, for example.

In one or more embodiments, the light reception surface has no electrode formed (back electrode type), and such a solar cell has high receiving efficiency of sunlight, and thus the photoelectric conversion efficiency thereof is high.

<First Conductivity Type Semiconductor Layer and Second Conductivity Type Semiconductor Layer>

In one or more embodiments, the first conductivity type semiconductor layer 25 is formed on a part of the back surface of the semiconductor substrate 11 (mainly, in the first conductivity type region 7) via the junction layer 23. In one or more embodiments, the second conductivity type semiconductor layer 35 is formed on a different part of the back surface of the semiconductor substrate 11 (mainly, in the second conductivity type region 8) via the junction layer 33. In this way, the first conductivity type semiconductor layer 25 and the junction layer 23, and the second conductivity type semiconductor layer 35 and the junction layer 33 have strip-like shapes extending in the Y direction (first direction) and are arranged alternately in the X direction (second direction). The first conductivity type semiconductor layer 25 and the junction layer 23, and the second conductivity type semiconductor layer 35 and the junction layer 33 extend further to the boundary region 9. In the boundary region 9, a part of the second conductivity type semiconductor layer 35 and a part of the junction layer 33 lie over a part of the first conductivity type semiconductor layer 25 and a part of the junction layer 23. This eliminates a region in the absence of a semiconductor layer even allowing for manufacturing error to increase photoelectric conversion efficiency.

The first conductivity type semiconductor layer 25 is formed as a first conductivity type silicon-based layer, for example, a p-type silicon-based layer. The second conductivity type semiconductor layer 35 is formed as a silicon-based layer of a second conductivity type different from the first conductivity type, for example, an n-type silicon-based layer. The first conductivity type semiconductor layer 25 may be an n-type silicon-based layer, and the second conductivity type semiconductor layer 35 may be a p-type silicon-based layer. Each of the p-type silicon-based layer and the n-type silicon-based layer is formed of an amorphous silicon layer or a microcrystal silicon layer containing amorphous silicon and crystal silicon. Boron (B) may be used as dopant impurities in the p-type silicon-based layer. Phosphorus (P) may be used as dopant impurities in the n-type silicon-based layer.

<Junction Layer>

In one or more embodiments, the junction layers 23 and 33 are formed as intrinsic silicon-based layers. The junction layers 23 and 33 function as passivation layers, and suppress carrier recombination.

<First Electrode Layer and Second Electrode Layer>

In one or more embodiments, the first electrode layer 27 is formed on the first conductivity type semiconductor layer 25. The second electrode layer 37 is formed on the second conductivity type semiconductor layer 35. In this way, the first electrode layer 27 and the second electrode layer 37 have strip-like shapes extending in the Y direction (first direction) and are arranged alternately in the X direction (second direction). The first electrode layer 27 includes a transparent electrode layer 28 and a metal electrode layer 29 sequentially laminated on the first conductivity type semiconductor layer 25. The second electrode layer 37 includes a transparent electrode layer 38 and a metal electrode layer 39 sequentially laminated on the second conductivity type semiconductor layer 35.

<<Transparent Electrode Layer>>

In one or more embodiments, the transparent electrode layers 28 and 38 are formed as transparent conductive layers made of a transparent conductive material. The transparent electrode layers 28 and 38 may have multilayer structures. In this case, a layer 28a and a layer 38a each in a first layer of the corresponding multilayer structures contacting the first conductivity type semiconductor layer 25 and the second conductivity type semiconductor layer 35 respectively have thicknesses that may be equal to or less than halves of the thicknesses of a layer 28b and a layer 38b respectively each in a second layer or a layer subsequent to the second layer. As the transparent conductive material, transparent conductive metal oxide is used, for example, indium oxide, tin oxide, zinc oxide, titanium oxide, and complex oxides thereof. An indium-based complex oxide mainly containing indium oxide may be particularly used in one or more embodiments. An oxide of indium may be used, from the viewpoint of high conductivity and transparency. Furthermore, a dopant may be added to an oxide of indium in order to ensure reliability or higher conductivity. Examples of the dopant include Sn, W, Zn, Ti, Ce, Zr, Mo, Al, Ga, Ge, As, Si and S.

<<Metal Electrode Layer>>

In one or more embodiments, the metal electrode layers 29 and 39 are made of a metal material. Examples of the metal material include Cu, Ag, Al, and an alloy of these materials. For simplification of manufacturing process, the transparent electrode layer 28 and the transparent electrode layer 38 may be made of the same material, and the metal electrode layer 29 and the metal electrode layer 39 may be made of the same material.

A physical vapor deposition (PVD) method such as a sputtering method is used as a method of forming the transparent electrode layer 28 and the transparent electrode layer 38, for example. More specifically, as will be described later, while the semiconductor substrate 11 is conveyed, an electrode material film is formed on the first conductivity type semiconductor layer 25 and the second conductivity type semiconductor layer 35 laminated on the back surface of the semiconductor substrate 11 using the physical vapor deposition method (electrode material film forming step). Next, using a photolithography method, for example, patterning is performed to remove a part of the electrode material film by etching to form the transparent electrode layers 28 and 38 separated from each other (patterning step).

In the back electrode type solar cell using the semiconductor substrate 11 having the uneven structure (texture structure) formed on the back surface, forming the transparent electrode layers 28 and 38 using the physical vapor deposition method in this manner increases a leakage current between the transparent electrode layers 28 and 38, and this may cause reduction in fill factor.

Figure 4A:
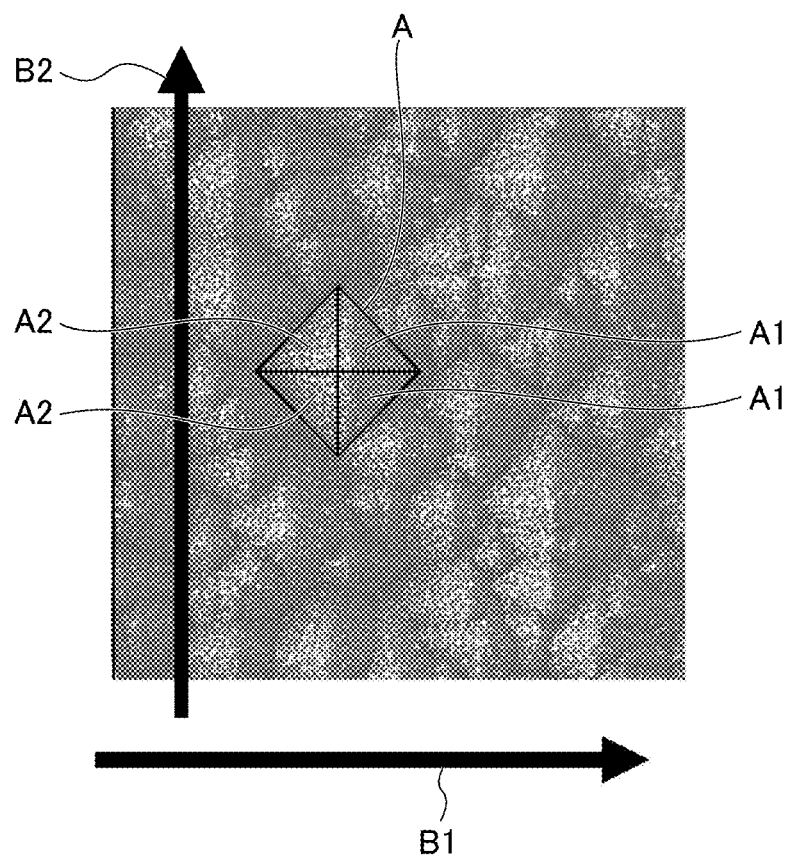
FIG. 4A shows a boundary region between transparent electrode layers in an enlarged manner.
Figure 4B:
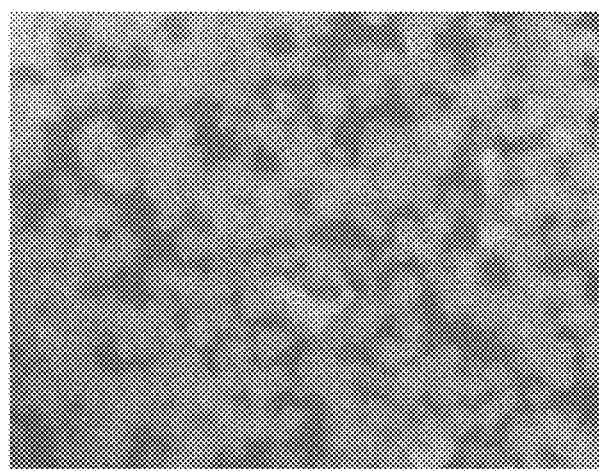
FIG. 4B shows a part of a side A2 of a protrusion A in FIG. 4A in a still enlarged manner.

The present inventors exceptionally found that this reduction is caused by residues of an electrode material left undissolved between the transparent electrode layers 28 and 38. FIG. 4A shows the boundary region 9 between the transparent electrode layers 28 and 38 in an enlarged manner. FIG. 4B shows a part of a side A2 of a protrusion A in FIG. 4A in a still enlarged manner. FIGS. 4A and 4B show an observation result obtained by using a scanning electron microscope. Observing the boundary region 9 between the transparent electrode layers 28 and 38 in this manner at a magnification of observation between 1000 and 100000 inclusive makes it possible to check a state of formation of residues (fine crystal grains) of the electrode material. This observation further makes it possible to see a coverage of the residues (fine crystal grains) of the electrode material in the boundary region 9 between the transparent electrode layers 28 and 38 and the sizes of the residues. If the electrode layer has a considerably small thickness such as a thickness between 1 and 20 nm inclusive, a transmission electron microscope may be used, for example. In this case, observing a cross section including the boundary region 9 between the transparent electrode layers 28 and 38 at a magnification of observation between 100000 and 1000000 inclusive makes it possible to check a state of formation of the residues (fine crystal grains) of the electrode material. In FIG. 4A, a conveyance direction of the semiconductor substrate 11 at the time of formation of the electrode material film using the physical vapor deposition method is indicated by B1, and a direction intersecting the conveyance direction B1 is indicated by B2.

As shown in FIGS. 4A and 4B, there are not many residues (fine crystal grains appearing white) of the electrode material left undissolved on a side A1 of the protrusion A having a quadrangular pyramidal shape (pyramidal shape) closer to the conveyance direction B1 (namely, a side exposed to plasma first and thus subjected to serious damage of the PVD). On the other hand, many residues of the electrode material left undissolved remain on the side A2 of the protrusion A opposite the conveyance direction B1 (namely, a side exposed to plasma later). These residues are left undissolved in shapes (triangular shapes in a front view) in which parts of the sides A2 of the protrusion A are reflected. These residues are connected in the direction B2 intersecting the conveyance direction B1. A possible reason for this is that, during formation of the electrode material film by the physical vapor deposition method, fine crystal grains highly resistant to an etching solution are generated in the electrode material film and these fine crystal grains are left undissolved as residues during a subsequent etching step of the electrode material film.

Thus, if the semiconductor substrate 11 is conveyed in the Y direction (first direction parallel to the strip-like electrode layer) during implementation of the physical vapor deposition method, residues 28p of the electrode material are connected in the X direction (second direction) as shown in FIG. 5B to form a bridge between the transparent electrode layers 28 and 38. This increases a leakage current between the transparent electrode layers 28 and 38 to cause reduction in fill factor (FF).

Residues (fine crystal grains) of the electrode material may be eliminated by extending a duration of etching process or increasing the temperature of an etching solution. However, this makes the size of a transparent electrode layer smaller than that of an intended shape as a result of under-etching performed directly below a resist pattern during patterning of the electrode material film, or causes damage on a semiconductor layer due to excessive immersion of the semiconductor layer in an etching solution in a region without a residue. These they may increase series resistance in the transparent electrode layer or reduce a fill factor due to shortening of a carrier lifetime in the semiconductor substrate.

In this regard, in a solar cell manufacturing method according to one or more embodiments, the semiconductor substrate 11 is conveyed in the X direction (second direction intersecting the electrode layer) during implementation of the physical vapor deposition method. By doing so, as shown in FIG. 5A, the residues 28p of the electrode material are not connected in the X direction (second direction) but are connected in the Y direction (first direction) to prevent formation of a bridge between the transparent electrode layers 28 and 38. This suppresses increase in leakage current between the transparent electrode layers 28 and 38 to suppress reduction in fill factor (FF).

<<Residues of Electrode Material>>

As described above, as shown in FIGS. 5A and 4A, in the solar cell 1 according to one or more embodiments, the residues 28p (fine crystal grains) of the electrode material forming the transparent electrode layers 28 and 38 are present between the first electrode layer 27 and the second electrode layer 37 adjacent to each other (in the boundary region 9). Some of the residues 28p have shapes (triangular shapes in a front view) in which parts of the sides A2 of the protrusion A having a quadrangular pyramidal shape (pyramidal shape) are reflected, and are connected in the Y direction (first direction parallel to the electrode layer). The residues 28p are not connected in the X direction (second direction intersecting the electrode layer).

<Solar Cell Manufacturing Method>

The solar cell manufacturing method according to one or more embodiments will be described next by referring to FIGS. 6A to 6J. FIGS. 6A to 6E show a first conductivity type semiconductor layer forming step in the solar cell manufacturing method according to one or more embodiments. FIGS. 6F and 6G show a second conductivity type semiconductor layer forming step in the solar cell manufacturing method according to one or more embodiments. FIGS. 6H to 6J show an electrode forming step in the solar cell manufacturing method according to one or more embodiments.

<First Conductivity Type Semiconductor Layer Forming Step>

Figure 6A:
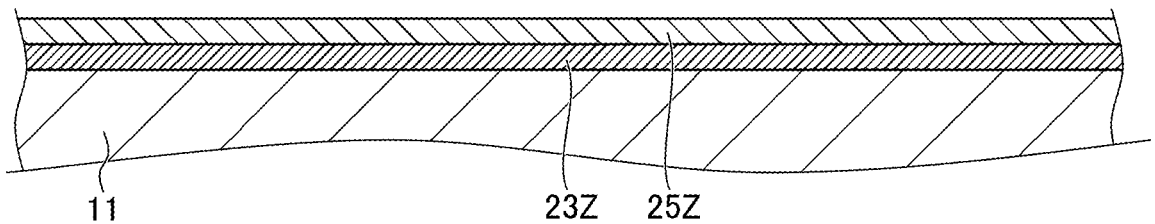
FIG. 6A shows a part of a first conductivity type semiconductor layer forming step in a solar cell manufacturing method according to one or more embodiments.

First, as shown in FIG. 6A, a junction layer material film (intrinsic silicon-based layer, for example) 23Z is laminated on the entire back surface of the semiconductor substrate (n-type single crystal silicon substrate, for example) having an uneven structure on at least the back surface. At this time, according to one or more embodiments, the junction layer (intrinsic silicon-based layer, for example) 13 is laminated on the entire light reception surface of the semiconductor substrate 11 (not shown). Next, a first conductivity type semiconductor material film (p-type silicon-based layer, for example) 25Z is laminated on the junction layer material film 23Z, namely, on the entire back surface of the semiconductor substrate 11.

While methods of forming the junction layer material film 23Z, the first conductivity type semiconductor material film 25Z, and the junction layer 13 are not particularly limited, a plasma CVD method may be used. Examples of conditions for film formation used in the plasma CVD method include a substrate temperature between 100 and 300° C. inclusive, a pressure between 20 and 2600 Pa inclusive, and high-frequency power density between 0.004 and 0.8 W/cm$^2$ inclusive. Examples of a material gas include silicon-containing gases such as $SiH_4$ and $Si_2H_6$, and mixed gases of silicon-based gases and $H_2$. As an example, hydrogen-diluted $B_2H_6$ may be used as a dopant addition gas in the first conductivity type semiconductor material film 25Z. A very small quantity of impurities of, for example, oxygen or carbon may be added in order to improve light transmittance. In this case, gas, for example, $CO_2$ or $CH_4$ is introduced during the film formation by the CVD method. The film formation using the plasma CVD method allows a film quality to be controlled relatively easily in a manner that depends on conditions for the film formation to facilitate control of resistance to an etchant or a refractive index.

Figure 6B:
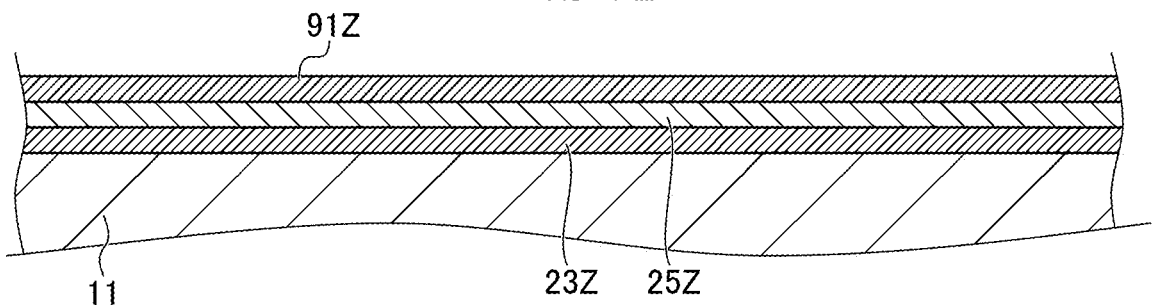
FIG. 6B shows a part of the first conductivity type semiconductor layer forming step in the solar cell manufacturing method according to one or more embodiments.

Next, as shown in FIG. 6B, a photoresist 91Z is formed on the first conductivity type semiconductor material film 25Z on the back surface of the semiconductor substrate 11. The photoresist 91Z may either be a positive-type photoresist or a negative-type photoresist. From the viewpoint of material availability and a level of patterning accuracy, a positive-type photoresist may be used. The following description proceeds under the condition that the positive-type photoresist is used. At this time, according to one or more embodiments, the anti-reflective layer 15 is formed on the junction layer 13 on the light reception surface of the semiconductor substrate 11 (not shown). While a method of forming the anti-reflective layer 15 is not particularly limited, a plasma CVD method achieving precise control of a film thickness may be used. The film formation by the CVD method achieves control of film quality by controlling material gas or conditions for the film formation.

Figure 6C:
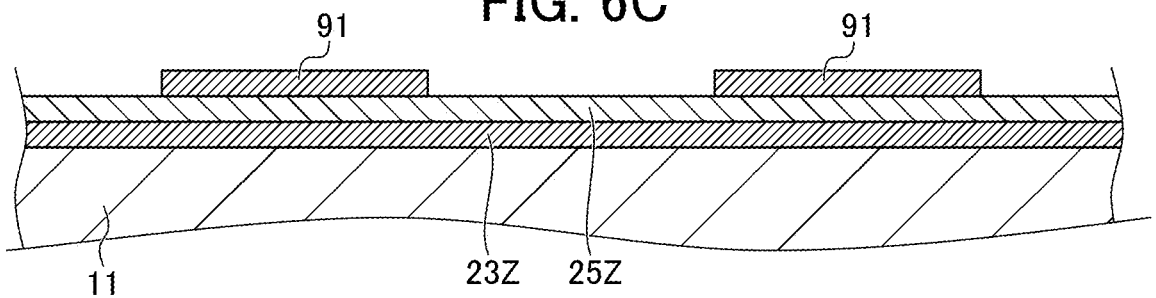
FIG. 6C shows a part of the first conductivity type semiconductor layer forming step in the solar cell manufacturing method according to one or more embodiments.

Next, as shown in FIG. 6C, using a photomask (not shown) for pattern formation of the first conductivity type semiconductor layer, the photoresist 91Z is exposed to light to remove a part of the photoresist 91Z in such a manner as to expose a part of the first conductivity type semiconductor layer in the first conductivity type semiconductor material film 25Z, thereby forming a photoresist 91.

Figure 6D:
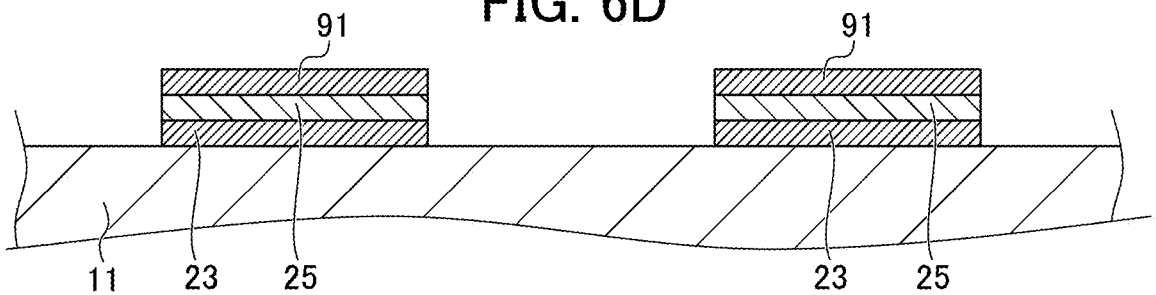
FIG. 6D shows a part of the first conductivity type semiconductor layer forming step in the solar cell manufacturing method according to one or more embodiments.

Next, as shown in FIG. 6D, using the photoresist 91 as a mask, a part of the first conductivity type semiconductor material film 25Z and a part of the junction layer material film 23Z are removed by etching to form the first conductivity type semiconductor layer 25 and the junction layer 23. An acid-based solution containing hydrofluoric acid may be used as an etching solution. An etching solution conforming to each layer is selected appropriately and the selected etching solution is used for each other.

Figure 6E:
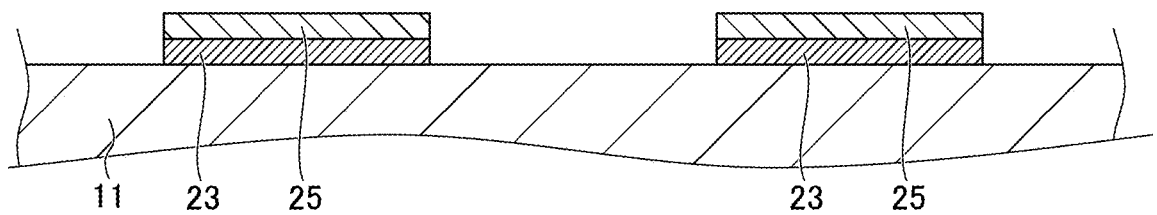
FIG. 6E shows a part of the first conductivity type semiconductor layer forming step in the solar cell manufacturing method according to one or more embodiments.
Figure 6F:
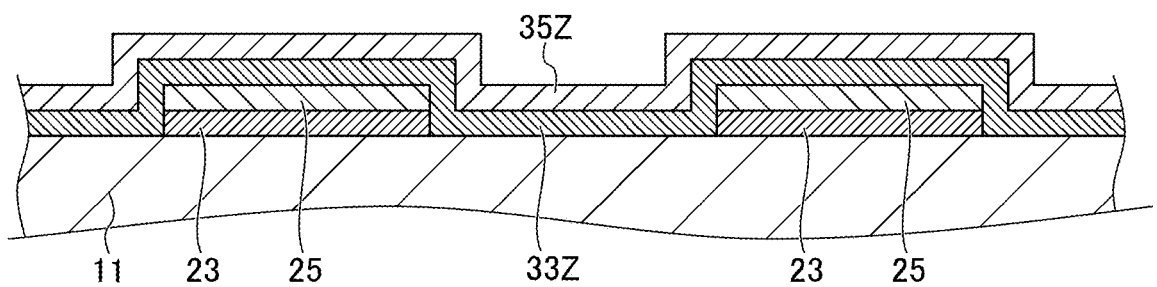
FIG. 6F shows a part of a second conductivity type semiconductor layer forming step in the solar cell manufacturing method according to one or more embodiments.
Figure 6G:
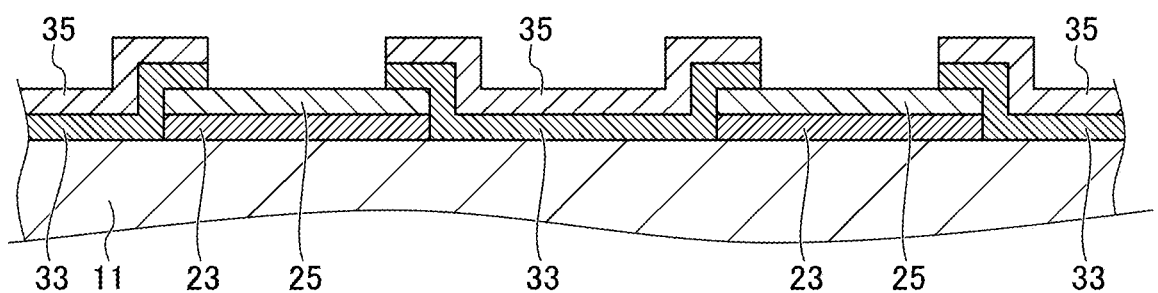
FIG. 6G shows a part of the second conductivity type semiconductor layer forming step in the solar cell manufacturing method according to one or more embodiments.
Figure 6H:
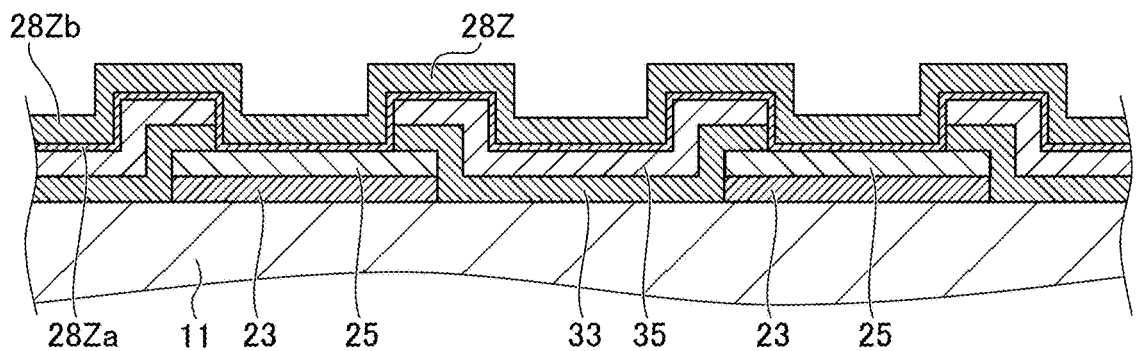
FIG. 6H shows a part of an electrode forming step in the solar cell manufacturing method according to one or more embodiments.
Figure 6I:
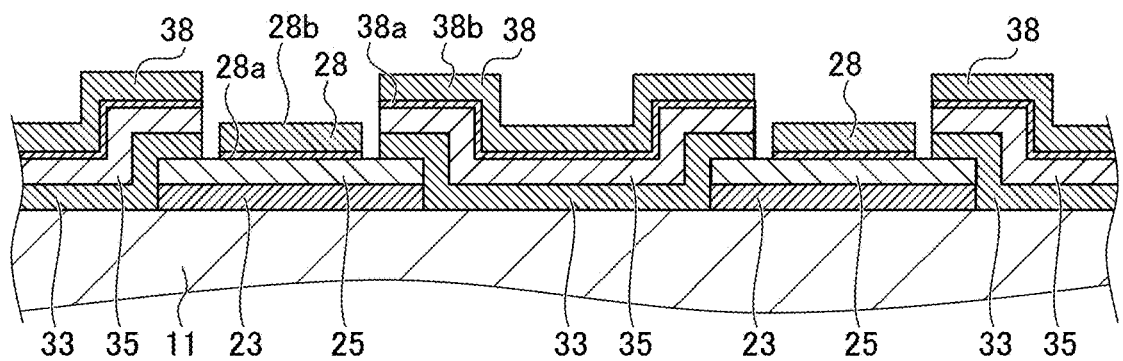
FIG. 6I shows a part of the electrode forming step in the solar cell manufacturing method according to one or more embodiments.
Figure 6J:
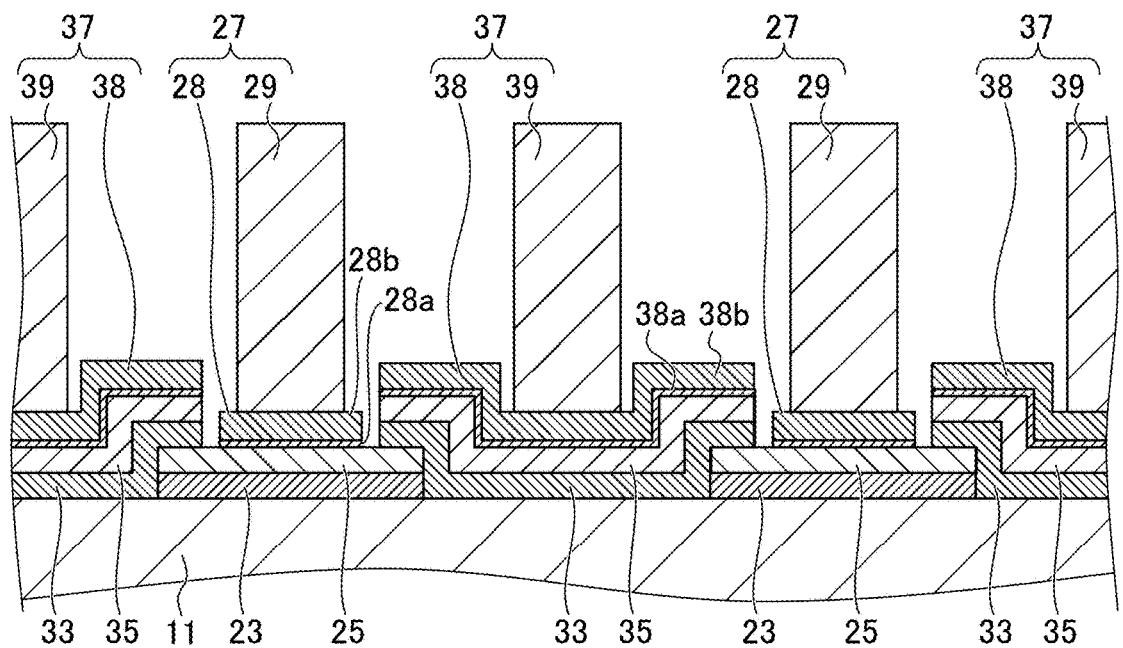
FIG. 6J shows a part of the electrode forming step in the solar cell manufacturing method according to one or more embodiments.

Next, as shown in FIG. 6E, the photoresist 91 is detached. In the foregoing first conductivity type semiconductor layer forming step, the etching method using photolithography technique is employed. Alternatively, a chemical vapor deposition method (CVD method) using a mask may be employed.

<Second Conductivity Type Semiconductor Layer Forming Step>

Next, as shown in FIG. 6F, a junction layer material film (intrinsic silicon-based layer, for example) 33Z is laminated on an exposed part of the back surface of the semiconductor substrate 11 and the first conductivity type semiconductor layer 25, namely, on the entire back surface of the semiconductor substrate 11. Then, a second conductivity type semiconductor material film (n-type silicon-based layer, for example) 35Z is laminated on the junction layer material film 33Z, namely, on the entire back surface of the semiconductor substrate 11. While methods of forming the junction layer material film 33Z and the second conductivity type semiconductor material film 35Z are not particularly limited, a plasma CVD method may be used like in the formation of the junction layer material film 23Z and the first conductivity type semiconductor material film 25Z described above. As an example, hydrogen-diluted $PH_3$ may be used as a dopant addition gas in the second conductivity type semiconductor material film 35Z. The semiconductor substrate 11 may be cleaned before implementation of the steps of forming the junction layer material film 33Z and the second conductivity type semiconductor material film 35Z, the semiconductor substrate 11 may be cleaned using an aqueous solution of hydrofluoric acid.

Next, like in the foregoing steps described by referring to FIGS. 6B to 6E, a part of the second conductivity type semiconductor material film 35Z and a part of the junction layer material film 33Z are removed by etching using a photoresist as a mask, thereby forming the second conductivity type semiconductor layer 35 and the junction layer 33 as shown in FIG. 6G.

<Electrode Layer Forming Step>
>>Electrode Material Film Forming Step>>

Next, as shown in FIG. 6H, a transparent electrode material film 28Z is laminated on the first conductivity type semiconductor layer 25 and the second conductivity type semiconductor layer 35, namely, on the entire back surface of the semiconductor substrate 11. A physical vapor deposition method (PVD) such as sputtering is used as a method of forming the transparent electrode material film 28Z. At this time, the transparent electrode material film 28Z is formed while the semiconductor substrate 11 is conveyed in the X direction (second direction) intersecting the strip-like first conductivity type semiconductor layer 25 and second conductivity type semiconductor layer 35 extending in the Y direction (first direction) to be formed in a patterning step described later. The semiconductor substrate 11 is conveyed repeatedly to form the transparent electrode material film 28Z into multiple layers. At this time, a speed of conveyance of the semiconductor substrate 11 is controlled in such a manner that a layer 28Za in a first layer of the multiple layers of the transparent electrode material film 28Z contacting the first conductivity type semiconductor layer 25 and the second conductivity type semiconductor layer 35 has a thickness that is equal to or less than a half of the thickness of a layer 28Zb in a second layer or a layer subsequent to the second layer, for example.

<<Patterning Step>>

Next, like in the foregoing steps described by referring to FIGS. 6B to 6E, a part of the transparent electrode material film 28Z is removed by etching using a photoresist as a mask (patterning), thereby forming the transparent electrode layer 28 on the first conductivity type semiconductor layer 25 and the transparent electrode layer 38 on the second conductivity type semiconductor layer 35, as shown in FIG. 6I. In this way, the strip-like transparent electrode layer 28 and transparent electrode layer 38 are formed in such a manner as to extend in the Y direction (first direction) and arranged in the X direction (second direction) intersecting the Y direction.

As shown in FIG. 6J, after implementation of the foregoing patterning step, the metal electrode layer 29 is formed on the transparent electrode layer 28 and the metal electrode layer 39 is formed on the transparent electrode layer 38. The metal electrode layers 29 and 39 may be formed using a method such as a screen printing method, a plating method, a wire bonding method, an inkjet method, a spraying method, a vacuum evaporation method, or sputtering, for example. A screen printing method using Ag paste or a plating method using copper plating is particularly used in one or more embodiments. As a result of the foregoing steps, the back electrode type solar cell 1 according to one or more embodiments is completed.

As described above, in the solar cell manufacturing method according to one or more embodiments, implemented on the back electrode type solar cell 1 using the semiconductor substrate 11 having an uneven structure (texture structure) on the back surface, the semiconductor substrate 11 is conveyed in the X direction (second direction intersecting the electrode layer) during formation of the electrode material of the transparent electrode layers 28 and 38 using a physical vapor deposition method. By doing so, as shown in FIG. 5A, the residues 28p of the electrode material are not connected in the X direction (second direction) but are connected in the Y direction (first direction) to prevent formation of a bridge between the transparent electrode layers 28 and 38. This suppresses increase in leakage current between the transparent electrode layers 28 and 38 to suppress reduction in fill factor.

The electrode forming method of one or more embodiments that uses a physical vapor deposition method, employs a film formation technique using plasma, so that grains of the electrode material or buffer gas collide with the semiconductor substrate 11, the junction layers 23 and 33, and the conductive semiconductor layers 25 and 35 to cause damage on these layers. This shortens a carrier lifetime to reduce a fill factor. In this regard, in the solar cell manufacturing method according to one or more embodiments, the electrode material film is formed into multiple layers. This makes it possible to shorten time of collision of grains of the electrode material or buffer gas with the semiconductor substrate 11, the junction layers 23 and 33, and the conductive semiconductor layers 25 and 35 during formation of a first layer. This further makes it possible to alleviate damage on a second layer or a layer subsequent to the second layer compared to damage on the first layer caused by film formation by the physical vapor deposition method. As a result, reduction in carrier lifetime is suppressed to suppress reduction in fill factor to a greater extent.

The presence of the residues (fine crystal grains) 28p of the electrode material between the transparent electrode layers 28 and 38 is expected to protect the first conductivity type semiconductor layer 25 and the second conductivity type semiconductor layer 35, suppress reduction in carrier lifetime during implementation of the steps, and improve reliability in terms of resistance to humidity, heat, etc.

While one or more embodiments according to the present invention have been described so far, the present invention is not limited to the above-described embodiments, and various modifications are available. In one or more embodiments, the heterojunction type solar cell as shown in FIG. 3 and the method of manufacturing the same have been described. In an example, the electrode forming method characteristic of one or more embodiments may be applied to various types of solar cells such as a homojunction type solar cell and methods of manufacturing such solar cells, not limited to such a heterojunction type solar cell.

While the electrode layer described as an example in one or more embodiments is composed of the transparent electrode layer and the metal electrode layer, the electrode layer may alternatively have a single-layer structure composed of a transparent electrode layer or a metal electrode layer. For example, the electrode forming method characteristic of one or more embodiments is further applicable to formation of a metal electrode layer having a single-layer structure using a physical vapor deposition method in a back electrode type solar cell using a semiconductor substrate having an uneven structure (texture structure) on a back surface.

EXAMPLES

One or more embodiments will be described in detail below on the basis of Examples. However, Examples described below do not limit the scope of this disclosure.

Example 1

<Production of Solar Cell>

As will be described later, the back electrode type solar cell 1 shown in FIGS. 2 and 3 was produced by following the steps shown in FIGS. 6A to 6J. First, an n-type single crystal silicon substrate having an incident plane direction (100) was prepared as the semiconductor substrate 11. The silicon substrate was cleaned in acetone and then immersed in a 2% by mass hydrofluoric acid aqueous solution for five minutes to remove a silicon oxide film from a surface, and then cleaned twice with ultrapure water. Subsequently, the silicon substrate was immersed in a mixed aqueous solution of 5% by mass of KOH and 15% by mass of isopropyl alcohol held at 75° C. for 15 minutes to etch the surface of the substrate, thereby forming a texture structure (uneven structure) on the surface of the substrate. Thereafter, the substrate was immersed in a 2% by mass hydrofluoric acid aqueous solution for five minutes, cleaned twice with ultrapure water, and dried at ordinary temperature. At this stage, the surface of the semiconductor substrate was observed under an atomic force microscope (AFM) manufactured by Pacific Nanotechnology, Inc. to see that etching proceeds to the greatest extent and a pyramidal texture structure (uneven structure) with an exposed (111) plane is formed on the surface of the substrate. The foregoing surface of the substrate was determined to have arithmetic mean roughness of 2100 nm and the thickness of the foregoing substrate was determined to be 160 nm. This thickness of the substrate was obtained by measuring a distance between protrusions on the front and back sides of the substrate.

Next, the etched substrate was introduced into a CVD device and a film of intrinsic amorphous silicon was formed as the junction layer 13 to a thickness of 10 nm on the light reception surface of the semiconductor substrate 11. The film-forming conditions for the intrinsic amorphous silicon were as follows: a substrate temperature was 180° C., a pressure was 130 Pa, an $SiH_4/H_2$ flow rate ratio was 2/10, and input power density was 0.03 W/cm$^2$. According to present Example, the film thickness of the thin film is a value calculated from a film-forming rate obtained by measuring the film thickness of a thin film formed on the silicon substrate under the same conditions using spectroscopic ellipsometry (trade name: M2000; manufactured by J. A. Woollam Corporation).

Likewise, a film of intrinsic amorphous silicon was formed as the junction layer material film 23Z to a thickness of 5 nm on the back surface of the semiconductor substrate 11 by a CVD method. Next, a film of p-type amorphous silicon was formed as the first conductivity type semiconductor material film 25Z to a thickness of 10 nm on the junction layer material film 23Z. The film of the intrinsic amorphous silicon was formed under the same film-forming conditions as those employed on the light reception surface side. The film-forming conditions for the p-type amorphous silicon were as follows: a substrate temperature was 190° C., a pressure was 130 Pa, an $SiH_4/H_2/B_2H_6$ flow rate ratio was 1/10/3, and input power density was 0.04 W/cm². The $B_2H_6$ gas flow rate herein is a flow rate of a diluent gas diluted with $H_2$ to a $B_2H_6$ concentration of 5000 ppm.

The photoresist 91Z was formed in such a manner as to practically cover the first conductivity type semiconductor material film 25Z formed in the foregoing manner. Next, using a photomask, the photoresist 91Z was exposed in a part to ultraviolet light and then developed in a KHO aqueous solution. Then, the part of the photoresist 91Z was removed and the photoresist 91 was formed, thereby exposing a part of the first conductivity type semiconductor material film 25Z.

Next, using the photoresist 91 as a mask, the first conductivity type semiconductor material film 25Z and the junction layer material film 23Z were etched with mixed acid of HF and $HNO_3$ to form the first conductivity type semiconductor layer 25 and the junction layer 23 in such a manner as to expose the back surface of the semiconductor substrate 11. The photoresist 91 was thereafter detached and removed using a mixed organic solvent of ethanol, acetone, and isopropyl alcohol.

Next, the substrate contaminated by the etching was cleaned with an HF aqueous solution, introduced into a CVD device, and a film of intrinsic amorphous silicon was formed as the junction layer material film 33Z to a thickness of 5 nm on the entire back surface. The film-forming conditions for the intrinsic amorphous silicon were as follows: a substrate temperature was 180° C., a pressure was 130 Pa, an $SiH_4/H_2$ flow rate ratio was 2/10, and input power density was 0.03 W/cm².

Next, a film of n-type amorphous silicon was formed as the second conductivity type semiconductor material film 35Z to a thickness of 10 nm on the junction layer material film 33Z. The film-forming conditions for the n-type amorphous silicon were as follows: a substrate temperature was 180° C., a pressure was 60 Pa, an $SiH_4/PH_3$ flow rate ratio was 1/2, and input power density was 0.02 W/cm². The $PH_3$ gas flow rate herein is a flow rate of a diluent gas diluted with $H_2$ to a $PH_3$ concentration of 5000 ppm.

Further, like in the patterning of the first conductivity type semiconductor material film 25Z and the junction layer material film 23Z, a photoresist was formed in such a manner as to practically cover the resultant second conductivity type semiconductor material film 35Z. Next, using a photomask, the photoresist was exposed in a part to ultraviolet light and then developed in a KHO aqueous solution. Then, the part of the photoresist was removed to form a patterned photoresist.

Then, using the patterned photoresist, the second conductivity type semiconductor material film 35Z and the junction layer material film 33Z on the first conductivity type semiconductor layer 25 were removed by etching using a KOH aqueous solution, thereby forming the second conductivity type semiconductor layer 35 and the junction layer 33 in such a manner as to expose a surface of the first conductivity type semiconductor layer 25. Next, while the substrate 11 was conveyed in a direction vertical to (intersecting) the strip-like transparent electrode layers 28 and 38 to be formed by an etching method described later, a film of indium tin oxide (ITO; refractive index of 1.9) was formed at two stages, one to a thickness of 10 nm and the other to a thickness of 70 nm, to have a total thickness of 80 nm by a physical vapor deposition method on the substantially entire back surface in the presence of the first conductivity type semiconductor layer 25 and the second conductivity type semiconductor layer 35. As a result, the transparent electrode material film 28Z was formed. Regarding conditions for forming ITO into the electrode material film, a material prepared by adding 10% by mass of tin to indium oxide was used as a target, a substrate temperature was set at room temperature, a pressure was set at 0.3 Pa in an argon atmosphere, and power density of 0.5 W/cm² was applied.

Next, a part of the transparent electrode material film 28Z was removed by etching using hydrochloric acid to separate the transparent electrode material film 28Z into the transparent electrode layer 28 and the transparent electrode layer 38.

Finally, Ag paste was applied by screen printing onto the transparent electrode layer 28 and the transparent electrode layer 38 to form the metal electrode layer 29 and the metal electrode layer 39. The transparent electrode layer 28 and the metal electrode layer 29 form the first electrode layer 27. The transparent electrode layer 38 and the metal electrode layer 39 form the second electrode layer 37. The solar cell 1 produced in the foregoing manner was observed under a scanning electron microscope at a magnification of 80000 to see that residues (fine crystal grains) of the electrode material are aligned in a direction parallel to the strip-like transparent electrode layers 28 and 38 between the transparent electrode layers 28 and 38 and that a bridge is not formed between the transparent electrode layers 28 and 38.

Example 2

The solar cell 1 was produced in the same manner as in Example 1 except that, in the steps of producing the solar cell 1, the transparent electrode material film 28Z was formed at a time to a thickness of 80 nm. The produced solar cell 1 was observed under a scanning electron microscope at a magnification of 80000 to see that residues (fine crystal grains) of the electrode material do not form a bridge between the transparent electrode layers 28 and 38.

Comparative Example 1

A solar cell was produced in the same manner as in Example 1 except that, in the steps of producing the solar cell 1, the substrate 11 was conveyed during formation of the transparent electrode material film 28Z in a direction parallel to the strip-like transparent electrode layers 28 and 38 to be formed by an etching method. The produced solar cell was observed under a scanning electron microscope at a magnification of 80000 to see that residues (fine crystal grains) of the electrode material form a bridge between the transparent electrode layers 28 and 38.

Comparative Example 2

A solar cell was produced in the same manner as in Comparative Example 1 except that, in the steps of producing the solar cell 1, the transparent electrode material film 28Z was formed at a time to a thickness of 80 nm. The produced solar cell was observed under a scanning electron microscope at a magnification of 80000 to see that residues (fine crystal grains) of the electrode material form a bridge between the transparent electrode layers 28 and 38.

The photoelectric conversion characteristics of the solar cells according to Examples 1 and 2 and those of the solar cells according to Comparative Examples 1 and 2 were measured in terms of open-circuit voltage Voc, short-circuit current Isc, leakage current Ileak, and fill factor FF. Results of the measurements are shown in Table 1. In table 1, on the basis of results about Voc, Isc, Ileak, and FF according to Example 2 set at 1.00, respective results according to Example 1 and Comparative Examples 1 and 2 are shown as relative ratios. A result about Ileak was obtained at −2 V and shows a ratio between current I (−2 V) and Isc (I(−2 V)/Isc).

TABLE 1

| | CONVEYANCE DIRECTION | THE NUMBER OF LAMINATIONS | Voc | Isc | Ileak | FF |
|---|---|---|---|---|---|---|
| Example 1 | VERTICAL | 2 | 1.00 | 1.00 | 1.00 | 1.01 |
| Example 2 | VERTICAL | 1 | 1.00 | 1.00 | 1.00 | 1.00 |
| Comparative Example 1 | PARALLEL | 2 | 1.00 | 1.00 | 1.02 | 1.00 |
| Comparative Example 2 | PARALLEL | 1 | 1.00 | 1.00 | 1.02 | 0.99 |

As seen from Table 1, in contrast to Comparative Example 1 in which residues (fine crystal grains) of the electrode material form a bridge between the transparent electrode layers 28 and 38 as a result of conveying the substrate 11 in a direction parallel to the strip-like transparent electrode layers 28 and 38 during formation of the transparent electrode material film 28Z, increase in Ileak is suppressed and reduction in FF is suppressed according to Example 1 in which residues (fine crystal grains) of the electrode material do not form a bridge between the transparent electrode layers 28 and 38 as a result of conveying the substrate 11 in a direction vertical to the strip-like transparent electrode layers 28 and 38 during formation of the transparent electrode material film 28Z. Likewise, in contrast to Comparative Example 2, increase in Ileak is suppressed and reduction in FF is suppressed according to Example 2. Main possible reason therefor is suppression of output loss due to leakage current or shunt resistance reduction to be caused by formation of a bridge of residues (fine crystal grains) of the electrode material between the transparent electrode layers 28 and 38.

In contrast to Example 2 in which the transparent electrode material film 28Z was formed at a time to a thickness of 80 nm, according to Example 1 in which the transparent electrode material film 28Z was formed at two stages, one to a thickness of 10 nm and the other to a thickness of 70 nm, reduction in FF is suppressed. Likewise, in contrast to Comparative Example 2, reduction in FF is suppressed according to Comparative Example 1. Main possible reason therefor is suppression of carrier lifetime reduction achieved by providing two layers separately for forming the transparent electrode material film 28Z.

As described above, conveying the substrate 11 in a direction vertical to (intersecting) the strip-like transparent electrode layers 28 and 38 during formation of the transparent electrode material film 28Z was found to reduce the occurrence of a bridge of residues (fine crystal grains) of the electrode material between the transparent electrode layers 28 and 38. As a result, this was found to achieve suppression of increase in leakage current between the transparent electrode layers 28 and 38 and suppression of reduction in fill factor. Further, providing two layers separately for forming the transparent electrode material film 28Z was found to suppress carrier lifetime reduction due to damage on this film by plasma used in a physical vapor deposition method to suppress reduction in fill factor to a greater extent.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCE NUMERALS

1 Solar cell
2 Wiring member
3 Light reception surface protective member
4 Back surface protective member
5 Sealing material
7 First conductivity type region
7b, 8b Bus bar part
7f, 8f Finger part
8 Second conductivity type region
9 Boundary region
11 Semiconductor substrate
13, 23, 33 Junction layer
15 Anti-reflective layer
25 First conductivity type semiconductor layer
27 First electrode layer
28, 38 Transparent electrode layer
28p Residue of electrode material
29, 39 Metal electrode layer
35 Second conductivity type semiconductor layer
37 Second electrode layer
100 Solar cell module

What is claimed is:

1. A back electrode type solar cell, comprising:
   a semiconductor substrate having an uneven structure containing a plurality of protrusions on at least a first surface;
   a first conductivity type semiconductor layer and a first electrode layer sequentially laminated on a first part of the first surface; and
   a second conductivity type semiconductor layer and a second electrode layer sequentially laminated on a second part of the first surface,
   wherein the first electrode layer and the second electrode layer each have a strip-like shape extending in a first direction and are arranged in a second direction intersecting the first direction,
   wherein the first and second electrode layers are both constituted of an electrode material,
   wherein residues of the electrode material are disposed between the first electrode layer and the adjacent second electrode layer adjacent, and
   wherein a plurality of the residues have shapes that reflect the shape of a part of a protrusion and are connected in the first direction.

2. The solar cell according to claim 1,
   wherein the protrusion has a quadrangular pyramidal shape, and the plurality of residues are triangular in a front view taken from the first surface.

3. The solar cell according to claim 1, wherein the first electrode layer and the second electrode layer each have a multilayer structure, and wherein a first layer of the multilayer structure has a thickness equal to or less than a half of the thickness of a second layer or a layer subsequent to the second layer.

4. The solar cell according to claim 1, wherein the electrode material is a conductive oxide.

5. A solar cell module comprising the solar cell according to claim 1.

6. The solar cell according to claim 2, wherein the first electrode layer and the second electrode layer each have a multilayer structure, and wherein a first layer of the multilayer structure has a thickness equal to or less than a half of the thickness of a second layer or a layer subsequent to the second layer.

7. The solar cell according to claim 2, wherein the electrode material is a conductive oxide.

8. The solar cell according to claim 3, wherein the electrode material is a conductive oxide.

* * * * *